US012604721B2

(12) United States Patent
Xiao et al.

(10) Patent No.: US 12,604,721 B2
(45) Date of Patent: Apr. 14, 2026

(54) REVERSE EMBEDDED POWER STRUCTURE FOR GRAPHICAL PROCESSING UNIT CHIPS AND SYSTEM-ON-CHIP DEVICE PACKAGES

(71) Applicant: NVIDIA Corporation, Santa Clara, CA (US)

(72) Inventors: Shawn Xiao, Santa Clara, CA (US); Justin Jiang, Santa Clara, CA (US); Henry Li, Santa Clara, CA (US); Jerry Zhou, Santa Clara, CA (US); Joey Jiao, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 753 days.

(21) Appl. No.: 17/964,583

(22) Filed: Oct. 12, 2022

(65) Prior Publication Data

US 2024/0096802 A1     Mar. 21, 2024

(51) Int. Cl.
| | |
|---|---|
| *H01L 23/528* | (2006.01) |
| *H01L 21/56* | (2006.01) |
| *H01L 21/768* | (2006.01) |
| *H01L 23/00* | (2006.01) |
| *H01L 23/29* | (2006.01) |

(Continued)

(52) U.S. Cl.
CPC .......... *H01L 23/5286* (2013.01); *H01L 21/56* (2013.01); *H01L 21/76816* (2013.01); *H01L 21/76877* (2013.01); *H01L 23/291* (2013.01); *H01L 23/481* (2013.01); *H01L 23/5226* (2013.01); *H01L 23/5283* (2013.01); *H01L 24/16* (2013.01); *H01L 24/32* (2013.01);

*H01L 24/48* (2013.01); *H01L 24/73* (2013.01); *H01L 25/16* (2013.01); *H01L 2224/16225* (2013.01); *H01L 2224/32225* (2013.01); *H01L 2224/48096* (2013.01); *H01L 2224/48225* (2013.01); *H01L 2224/48464* (2013.01); *H01L 2224/73204* (2013.01); *H01L 2224/73257* (2013.01); *H01L 2224/73265* (2013.01); *H01L 2924/1427* (2013.01); *H01L 2924/1434* (2013.01);

(Continued)

(58) Field of Classification Search
CPC ................................................... H01L 23/5286
See application file for complete search history.

(56) References Cited

U.S. PATENT DOCUMENTS

| | | | |
|---|---|---|---|
| 8,466,059 B2 * | 6/2013 | Chang ............... | H01L 21/76898 257/E21.585 |
| 9,219,032 B2 * | 12/2015 | Ramachandran ........................... | H01L 21/76898 |

(Continued)

*Primary Examiner* — William A Harriston

(57) ABSTRACT

A die including a die body having a first body surface, a second body surface on an opposite side of the die body as the first body surface, an interconnect region adjacent to the first body surface including interconnect dielectric layers with metal lines and vias, a transistor region above the interconnect region, the metal lines and vias making electrical connections to one or more power rails of the transistor region and electrically connected to transistors of the transistor region, a power region above the transistor region including an electro-conductive film on the second body surface and TSVs in the power region, an outer end of the TSV contacting the film and an embedded end of the TSVs contacting one of the power rails. A method of manufacturing an IC package and computer with the IC package are also disclosed.

20 Claims, 8 Drawing Sheets

Figure 1:
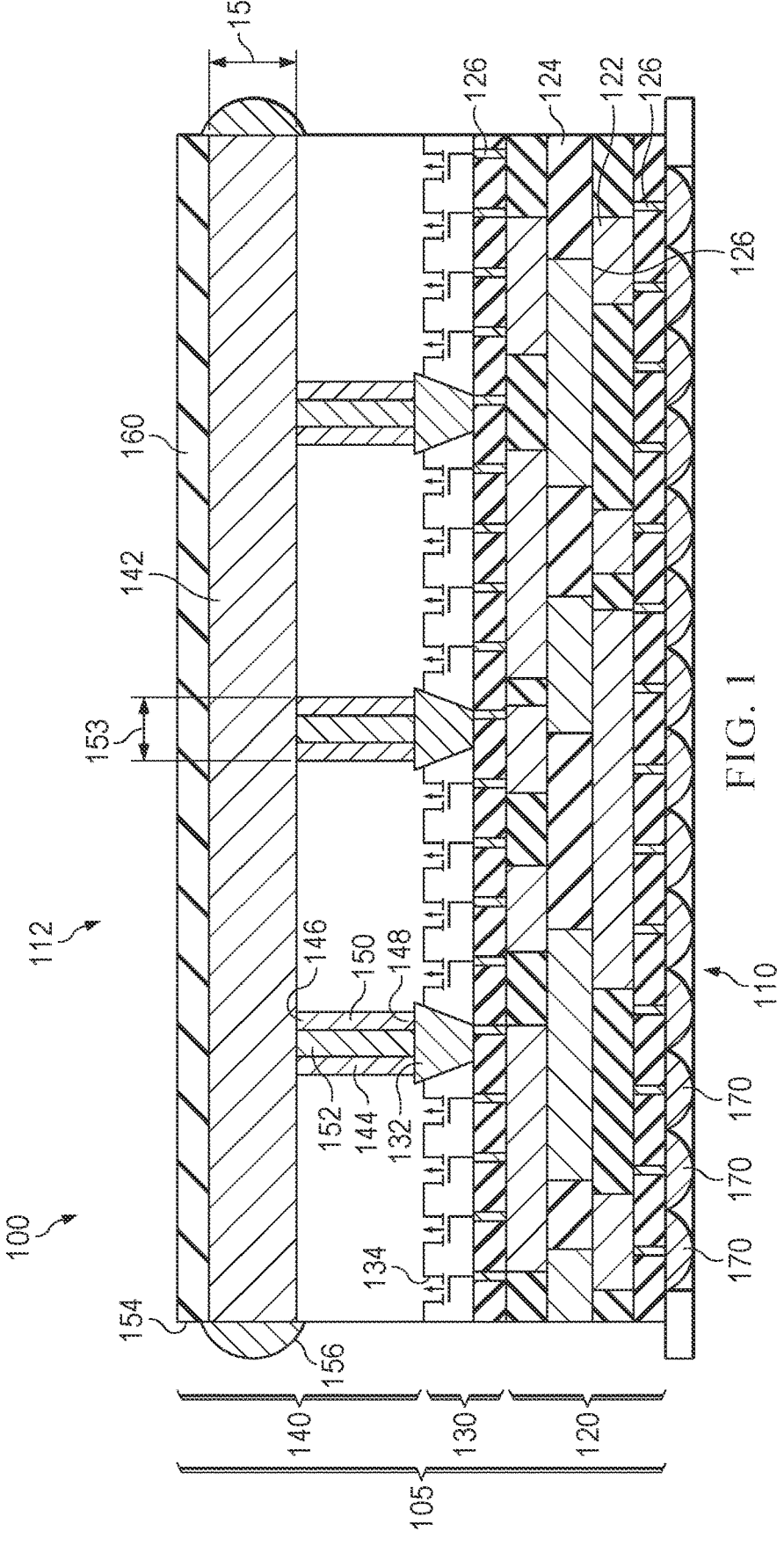

(51) Int. Cl.
    *H01L 23/48*        (2006.01)
    *H01L 23/522*     (2006.01)
    *H01L 25/16*      (2023.01)

(52) U.S. Cl.
    CPC .............. *H01L 2924/19041* (2013.01); *H01L 2924/19042* (2013.01); *H01L 2924/3011* (2013.01)

(56)            References Cited

U.S. PATENT DOCUMENTS

| | | | | |
|---|---|---|---|---|
| 9,728,481 | B2 * | 8/2017 | Yee | H01L 23/36 |
| 10,840,239 | B2 * | 11/2020 | Or-Bach | H10D 88/101 |
| 11,158,580 | B2 * | 10/2021 | Sio | H01L 23/5385 |
| 11,276,668 | B2 * | 3/2022 | Kim | H10D 1/68 |
| 11,444,068 | B2 * | 9/2022 | Song | H01L 23/49816 |
| 2002/0180025 | A1 * | 12/2002 | Miyata | H01L 25/0657 |
| | | | | 257/E29.022 |
| 2008/0006921 | A1 * | 1/2008 | Park | H01L 23/3128 |
| | | | | 257/E23.033 |
| 2008/0315409 | A1 * | 12/2008 | Cordes | H01L 25/0655 |
| | | | | 257/737 |
| 2009/0134527 | A1 * | 5/2009 | Chang | H01L 25/0657 |
| | | | | 438/109 |
| 2012/0292777 | A1 * | 11/2012 | Lotz | H01L 23/481 |
| | | | | 438/459 |
| 2013/0277855 | A1 * | 10/2013 | Kang | H01L 23/49816 |
| | | | | 257/774 |
| 2016/0322331 | A1 * | 11/2016 | Lim | H01L 24/11 |
| 2018/0145030 | A1 * | 5/2018 | Beyne | H01L 21/76898 |
| 2020/0321275 | A1 * | 10/2020 | Haba | H01L 23/50 |
| 2020/0373331 | A1 * | 11/2020 | Kim | H10D 86/215 |
| 2021/0118805 | A1 * | 4/2021 | Sio | H01L 23/481 |
| 2022/0020735 | A1 * | 1/2022 | Song | H01L 24/08 |
| 2022/0173033 | A1 * | 6/2022 | Kuo | H01L 23/5389 |
| 2022/0238525 | A1 * | 7/2022 | Kunitake | H10D 86/423 |
| 2022/0352080 | A1 * | 11/2022 | Yu | H01L 24/17 |
| 2024/0096802 | A1 * | 3/2024 | Xiao | H01L 24/32 |
| 2024/0186248 | A1 * | 6/2024 | Haba | H01L 23/49822 |
| 2025/0087632 | A1 * | 3/2025 | Chou | H01L 25/0657 |
| 2025/0210496 | A1 * | 6/2025 | Schaef | H01L 24/13 |

* cited by examiner

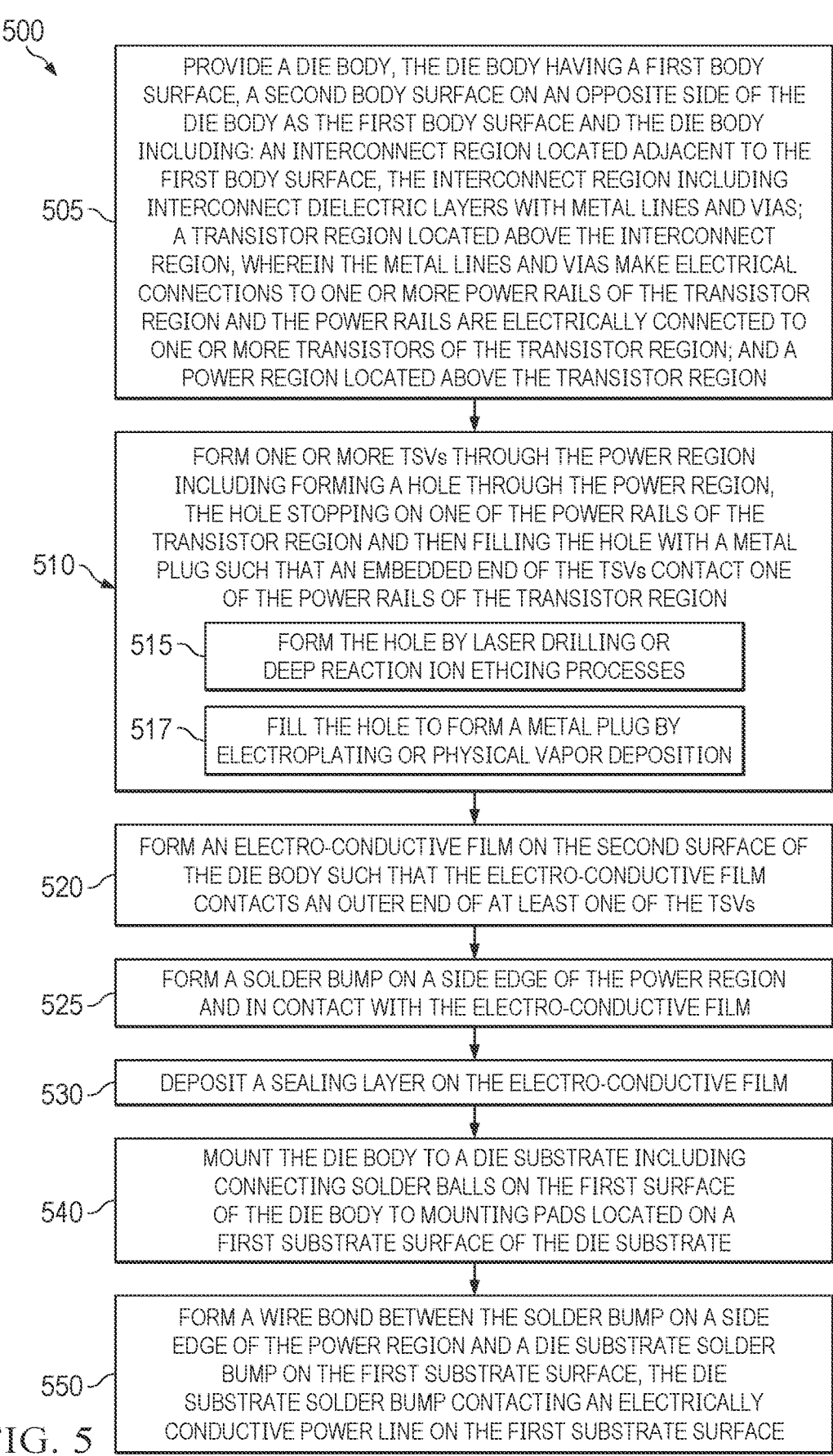

500

505 — PROVIDE A DIE BODY, THE DIE BODY HAVING A FIRST BODY SURFACE, A SECOND BODY SURFACE ON AN OPPOSITE SIDE OF THE DIE BODY AS THE FIRST BODY SURFACE AND THE DIE BODY INCLUDING: AN INTERCONNECT REGION LOCATED ADJACENT TO THE FIRST BODY SURFACE, THE INTERCONNECT REGION INCLUDING INTERCONNECT DIELECTRIC LAYERS WITH METAL LINES AND VIAS; A TRANSISTOR REGION LOCATED ABOVE THE INTERCONNECT REGION, WHEREIN THE METAL LINES AND VIAS MAKE ELECTRICAL CONNECTIONS TO ONE OR MORE POWER RAILS OF THE TRANSISTOR REGION AND THE POWER RAILS ARE ELECTRICALLY CONNECTED TO ONE OR MORE TRANSISTORS OF THE TRANSISTOR REGION; AND A POWER REGION LOCATED ABOVE THE TRANSISTOR REGION

510 — FORM ONE OR MORE TSVs THROUGH THE POWER REGION INCLUDING FORMING A HOLE THROUGH THE POWER REGION, THE HOLE STOPPING ON ONE OF THE POWER RAILS OF THE TRANSISTOR REGION AND THEN FILLING THE HOLE WITH A METAL PLUG SUCH THAT AN EMBEDDED END OF THE TSVs CONTACT ONE OF THE POWER RAILS OF THE TRANSISTOR REGION

515 — FORM THE HOLE BY LASER DRILLING OR DEEP REACTION ION ETHCING PROCESSES

517 — FILL THE HOLE TO FORM A METAL PLUG BY ELECTROPLATING OR PHYSICAL VAPOR DEPOSITION

520 — FORM AN ELECTRO-CONDUCTIVE FILM ON THE SECOND SURFACE OF THE DIE BODY SUCH THAT THE ELECTRO-CONDUCTIVE FILM CONTACTS AN OUTER END OF AT LEAST ONE OF THE TSVs

525 — FORM A SOLDER BUMP ON A SIDE EDGE OF THE POWER REGION AND IN CONTACT WITH THE ELECTRO-CONDUCTIVE FILM

530 — DEPOSIT A SEALING LAYER ON THE ELECTRO-CONDUCTIVE FILM

540 — MOUNT THE DIE BODY TO A DIE SUBSTRATE INCLUDING CONNECTING SOLDER BALLS ON THE FIRST SURFACE OF THE DIE BODY TO MOUNTING PADS LOCATED ON A FIRST SUBSTRATE SURFACE OF THE DIE SUBSTRATE

550 — FORM A WIRE BOND BETWEEN THE SOLDER BUMP ON A SIDE EDGE OF THE POWER REGION AND A DIE SUBSTRATE SOLDER BUMP ON THE FIRST SUBSTRATE SURFACE, THE DIE SUBSTRATE SOLDER BUMP CONTACTING AN ELECTRICALLY CONDUCTIVE POWER LINE ON THE FIRST SUBSTRATE SURFACE

FIG. 5

600

REVERSE EMBEDDED POWER STRUCTURE FOR GRAPHICAL PROCESSING UNIT CHIPS AND SYSTEM-ON-CHIP DEVICE PACKAGES

CROSS-REFERENCE TO RELATED APPLICATION

This application claims priority to CN Patent Application No. 202211124517.2, entitled "REVERSE EMBEDDED POWER STRUCTURE FOR GRAPHICAL PROCESSING UNIT CHIPS AND SYSTEM-ON-CHIP DEVICE PACKAGES", filed Sep. 15, 2022. The above-listed application is commonly assigned with the present application is incorporated herein by reference as if reproduced herein in its entirety.

TECHNICAL FIELD

This application is directed, in general, to dies having power structures for integrated circuit (IC) packages such as system-on-chip packages (SoC), and in particular, embedded power structures for graphical processing units (GPUs) and SoC packages.

BACKGROUND

Two continuing trends in GPU and SoC technology are the use of smaller on-chip transistors and the use of increasing number of transistors on chips, resulting in an increasing area or density of the chip being occupied by transistors. As the size of the transistors decrease and the number of transistors increase, the width and thickness of interconnection lines in interconnection layers of the chip die are also correspondingly decreased to interconnect the smaller sized and greater number of transistors. Often, to accomplish the greater number of interconnections per chip, more chip interconnection layers are used. Often, the increase in the chip area occupied by transistors can result is an overall or average increase in lengths of the interconnection lines. The decreasing width and thickness and increasing length of the interconnection lines can also cause substantial increases in the impedance of interconnection lines, which in turn, can introduce new problems with providing adequate power as increased total graphic power (TGP) requirements increase, and dealing with an increased need for heat dissipation and preventing signal integrity loss.

There is a continuing need to increase the power distribution to chip transistors to help avoid bottlenecks in improving chip performance.

SUMMARY

One aspect provides a die including a die body. The die body has a first body surface, a second body surface on an opposite side of the die body as the first body surface, the die body. The die body includes an interconnect region, a transistor region and a power region. The interconnect region is located adjacent to the first body surface and the interconnect region including interconnect dielectric layers with metal lines and vias. The transistor region is located above the interconnect region, and the metal lines and vias make electrical connections to one or more power rails of the transistor region and the power rails are electrically connected to one or more transistors of the transistor region. The power region is located above the transistor region, and the power region includes an electro-conductive film on the second body surface and through silicon vias (TSVs) embedded in the power region, wherein for each one of the TSVs, an outer end of the TSV contacts the electro-conductive film and an embedded end of the TSVs contacts one of the power rails of the transistor region.

Another aspect is a method of manufacturing IC package. The method includes providing a die body, the die body having a first body surface 110, a second body surface 112 on an opposite side of the die body as the first body surface and the die body includes the interconnect region, the transistor region and the power region. The method also includes forming one or more TSVs through the power region including forming a hole through the power region, the hole stopping on one of the power rails of the transistor region and then filling the hole with a metal plug such that an embedded end of the TSVs contact one of the power rails of the transistor region. The method further includes forming an electro-conductive film on the second surface of the die body such that the electro-conductive film contacts an outer end of at least one of the TSVs. The method also includes forming a solder bump on a side edge of the power region and in contact with the electro-conductive film.

Another aspect is a computer having one or more circuit that include the IC package include any embodiments of the die disclosed herein.

BRIEF DESCRIPTION

Figure 2:
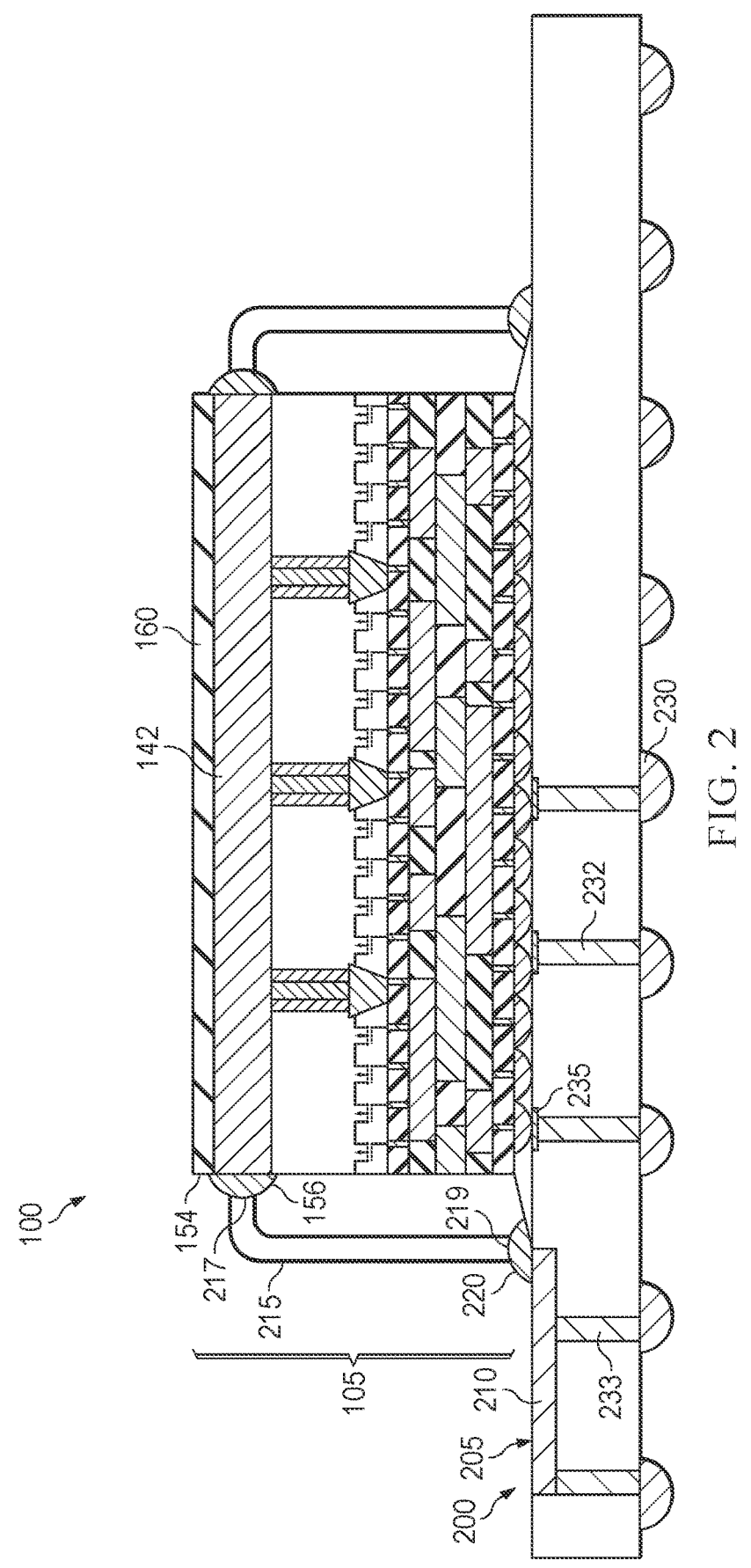
Figure 3A:
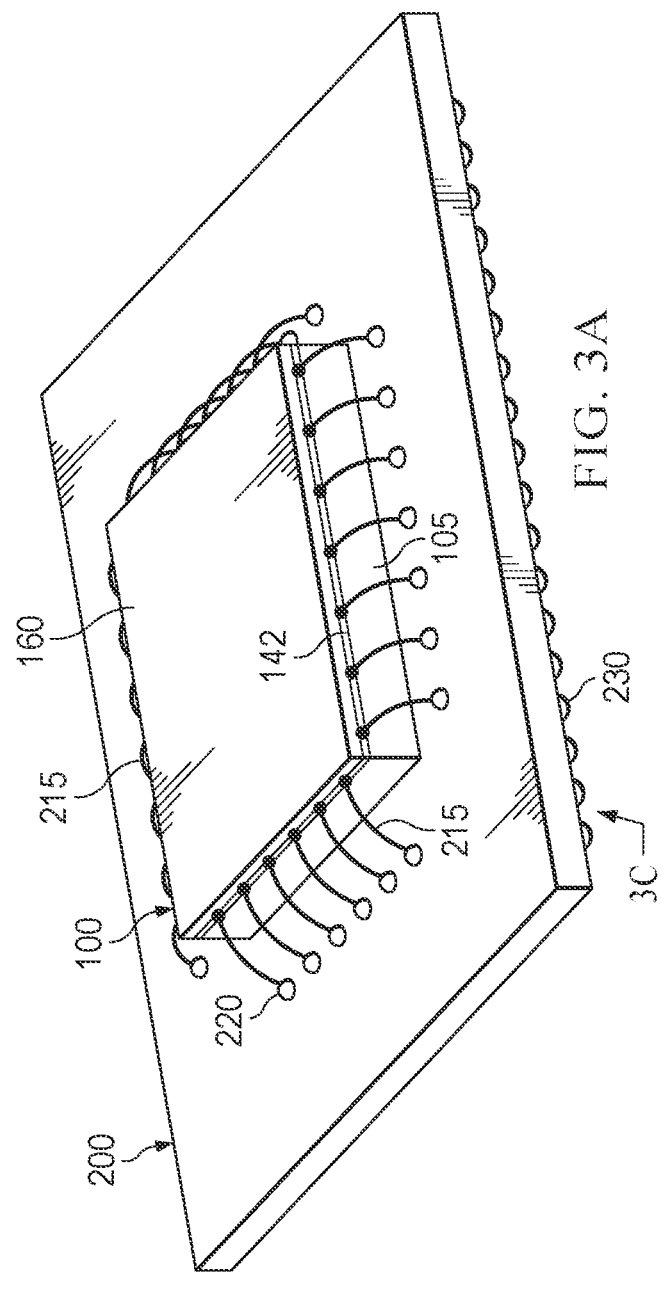
Figure 3B:
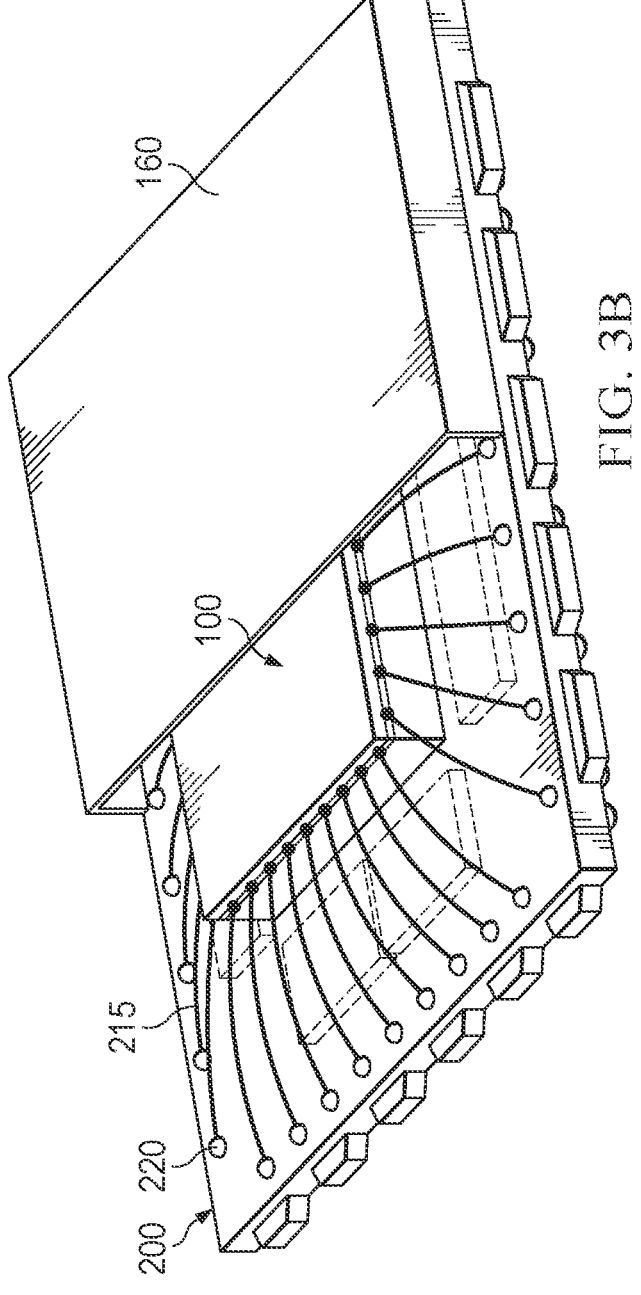
Figure 3C:
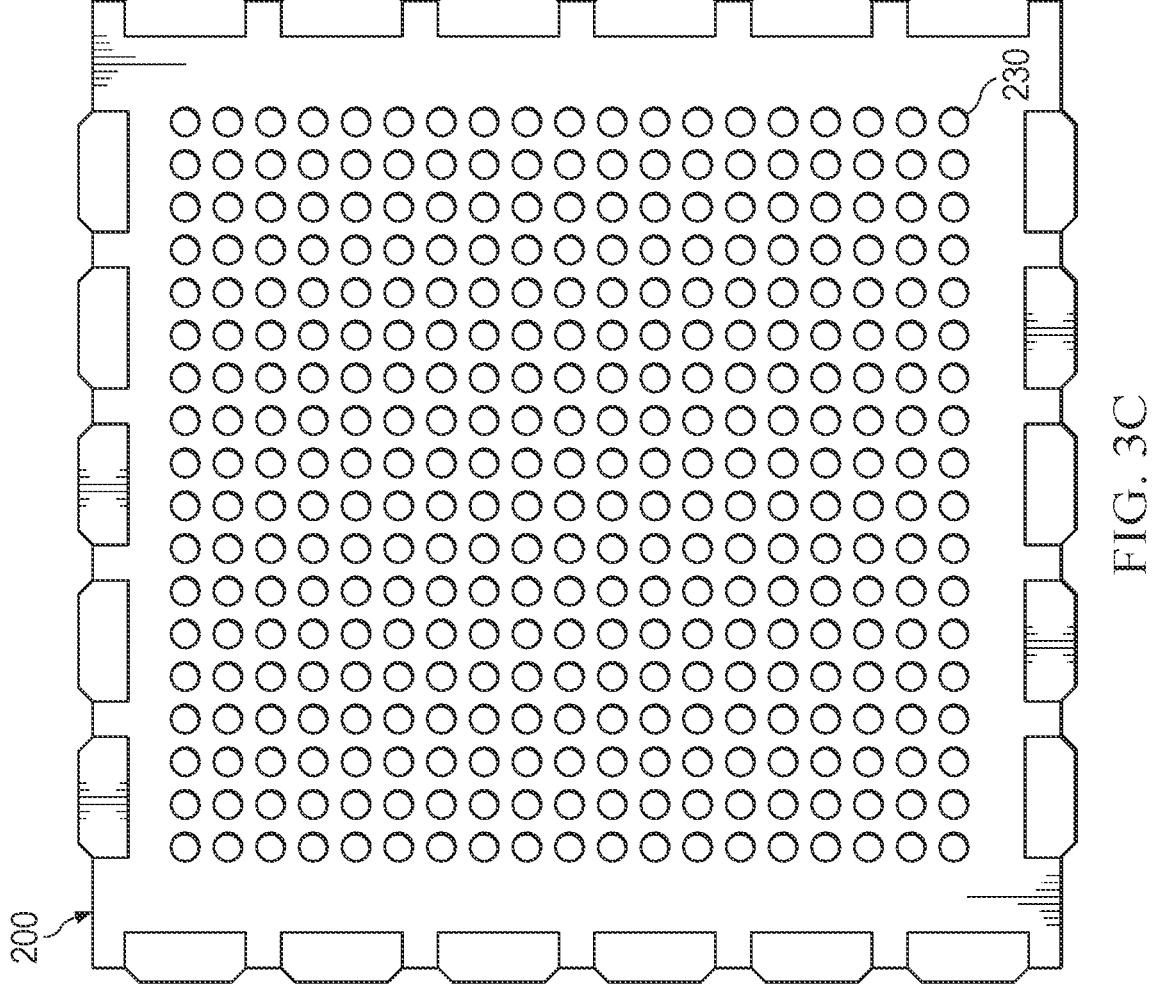
Figure 4:
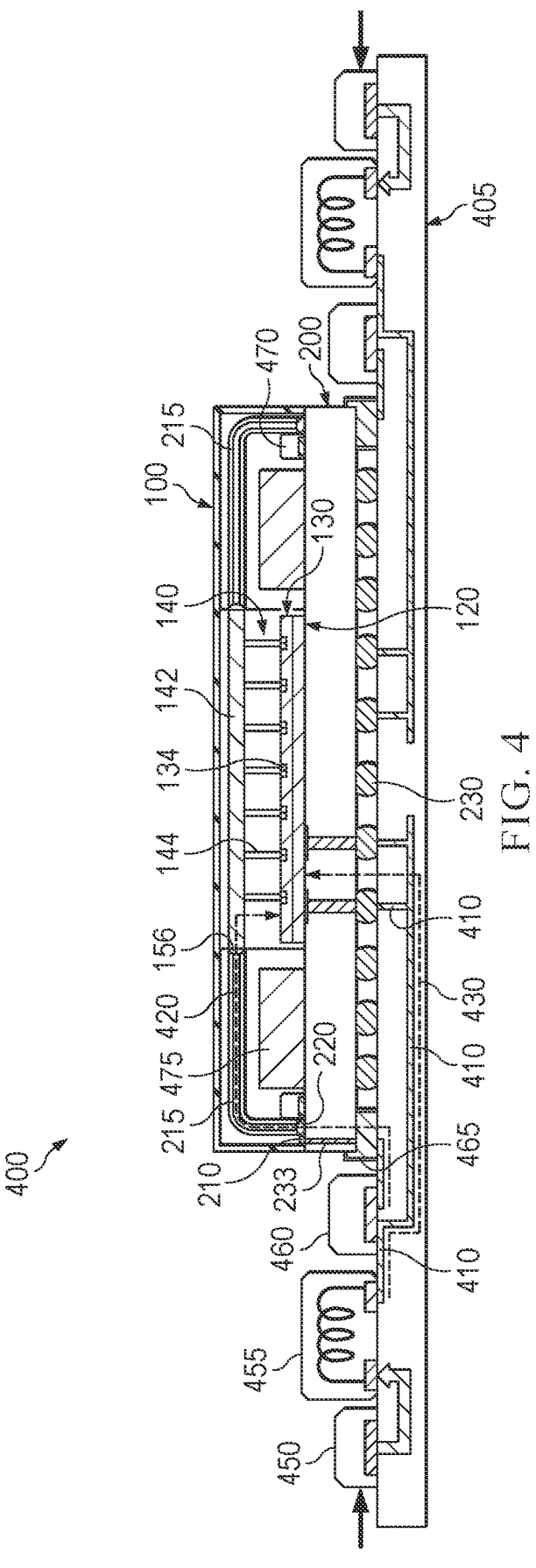
Figure 6:
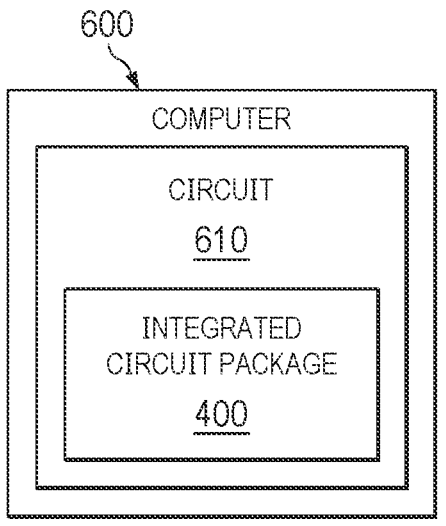

Reference is now made to the following descriptions taken in conjunction with the accompanying drawings, in which:

FIG. 1 presents a cross-sectional view of an example embodiment of a circuit die of the disclosure;

FIG. 2 presents a cross-sectional schematic view of an example embodiment of the circuit die of the disclosure, such as the circuit die shown in FIG. 1, mounted to a die substrate of the disclosure;

FIG. 3A presents a schematic perspective view of example embodiments of the circuit die and the die substrate of the disclosure such as the circuit die and the die substrate as shown in FIG. 2;

FIG. 3B presents another schematic perspective view of the circuit die and the die substrate of the disclosure, analogous to that shown in FIG. 3A, but with sealing and capacitor structures depicted;

FIG. 3C presents a plan view of an embodiment of the die substrate of the disclosure from an underside view as indicated in FIG. 3A;

FIG. 4 presents a schematic cross-sectional view of an example embodiment of the circuit die and the die substrate of the disclosure, such as disclosed in the context of FIGS. 1-3C, as part of an integrated circuit package of the disclosure;

FIG. 5 presents a flow diagram of example embodiments of a method of manufacturing an integrated circuit package of the disclosure, including any embodiments of the circuit die and die substrate such as disclosed in the context of FIGS. 1-4; and FIG. 6 presents a block diagram of a computer including one or more embodiments of the integrated circuit package made by the method of the disclosure such as disclosed in the context of FIGS. 1-5.

DETAILED DESCRIPTION

Embodiments of the disclosure follow from our realization that the reverse or opposite, non-transistor side in an upper space of a die (e.g., silicon die or circuit chip die or die) can provide additional electro-conductive paths for electric power delivery to chip transistors of the die. The new power structures that form the path can provide additional or alternative power sources to conventional power structure provided from an interconnect region underlying a transistor region of the die.

As further disclosed herein, the electro-conductive paths of our new reverse-situated power structures added to the die can include: through silicon vias (TSV) with metal plugs as vertical power conduits, electro-conductive films as horizontal power conduits, solder bumps, metal bonding wires and a overlying sealing layer. The TSVs monopolize and break though the upper region of the die (herein, a power region), where there are no conventional interconnection layers, to connect power from a power rail in a transistor region of the chip, to the transistors of the die. Because the TSVs break though the power region, the TSVs can be constructed to have a relatively large diameter to enable the delivery of larger amounts of electrical power than possible using conventional electrical lines and vias in the interconnection layers to provide power. Additionally, the hole of the TSV can be metallized to provide a high electrical conductivity current path to the chip's transistors.

Our power structures thereby increase power density delivery to the chip die because the heretofore unused upper spaces of the chip are used as a new electric current pathway to the transistors of the die.

We expect our new power structures will result in improved chip performance relative to analogous chips formed from the same substrate wafer (e.g., silicon wafer) because there will be reduced power losses and the space previously used to deliver power through the interconnection layers can now be used to make additional ground and signal connections, and/or the number of interconnection layers can be reduced, thereby reducing impedance through the interconnection and/or reducing the ground bounce noise and improving signal integrity. Further, because our power structure can decrease of the total impendence of the die, there will be less heat generation Additionally, because metal has a higher thermal conductivity than silicon, the mass of metalized TSVs introduced in the upper space of the chip die, can provide an improved heat dissipation route as compared to an upper chip space composed of silicon alone without such metallization.

One embodiment of the disclosure is a die. FIGS. 1-4 present various embodiments of the die 100. With continuing reference to FIGS. 1-4 throughout, the die 100 includes a die body 105 having a first body surface 110, a second body surface 112 on an opposite side of the die body as the first body surface. The die body includes an interconnect region 120, a transistor region 130 and a power region 140.

The interconnect region 120 includes interconnect dielectric layers 122 with metal lines 124 and vias 126. The transistor region 130 is located above the interconnect region and the metal lines 124 and vias 126 make electrical connections to one or more power rails 132 of the transistor region 130. The power rails are electrically connected to one or more transistors 134 of the transistor region. The power region 140 is located above the transistor region and the power region includes an electro-conductive film 142 on the second body surface and TSVs 144 embedded in the power region. For each one of the TSVs, an outer end 146 of the TSV contacts the electro-conductive film and an embedded end 148 of the TSVs contacts one of the power rails of the transistor region.

In some embodiment, a hole 150 of the TSVs in the power region contains a metal plug 152 (e.g., a copper, tungsten or other metal plug).

In some embodiments, a diameter 153 of the hole is a value in a range from 0.001 to 1000 microns (e.g., 0.1 to 200, 200 to 400, 400 to 600, 600 to 800 or 800 to 1000 in various embodiments). In some such embodiments, because the TSV is independent of the interconnection region of the die, a large hole diameter 153 can be constructed to support higher electric current requirements of the die (e.g., total die current flow requirement values from 100 to 1000, 300 to 1000 or 500 to 1000 amp in various embodiments). For instance, in some embodiments of the die, one of more the TSVs in the power region can have a diameter 153 in a range from 100 to 1000 microns, 300 to 1000, or 500 to 1000 microns, in various embodiments, to support a higher current flow through the TSV than possible for the conventional vias 126 in the interconnect region.

In some embodiments, to support the supply of high electric current requirements, the electro-conductive film 142 traverses the second body surface 112 to a side edge 154 of the die body, and one or more solder bumps 156 on the side edge of the die body contact the electro-conductive films. In some such embodiments, a thickness 158 of the electro-conductive film 142 is a value in a range from 1 to 1000 microns (e.g., 1 to 100, 100 to 200, 200 to 400, 400 to 600, 600 to 800, or 800 to 1000, in various embodiments). For instance, in some embodiments of the die, one of more the films in the power region can have a thickness 158 in a range from 100 to 1000, 300 to 1000, or 500 to 1000 microns, in various embodiments, to support a higher current flow through the firm than possible using conventional conductive lines in the interconnect region.

Some embodiments of the die 100 include a die substrate 200. The die body 105 can be located on a first substrate surface 205 of the die substrate, one or more substrate conductive lines 210 can located on the first substrate surface and a wire bond 215 can electrically connect the substrate conductive lines 210 to the electro-conductive films 142.

In some such embodiments, one end 217 of the wire bond can contact a first solder bump 156 located on a side edge 154 of the die body 105, the first solder bump contacting the electro-conductive films 142. An opposite end 219 of the wire bond can contact a die substrate solder bump 220 on the first substrate surface 205, the die substrate solder bump 220 contacting one of the substrate conductive lines 210.

In some such embodiments, the die 105 and the die substrate 200 can be part of an IC package 400. The die substrate 200 can mounted to a package substrate 405, the package substrate including package conductive lines 410 and the substrate conductive lines 210 electrically connected to form a first electric current pathway 420 to the transistors 134 of the die body 105. The first electric current pathway 420 can include: the substrate conductive lines 210, the wire bond 215, the die substrate solder bump 220, substrate vias 233, the first solder bump 156, the electro-conductive films 142 and the TSVs 144 of the power region 140 of the die body 105.

In some such embodiments, the package conductive lines 410 can be electrically connected to form a second electric current pathway 430 to the transistors 134 of the die body 105. The second electric current pathway 430 can include: die substrate solder balls 230, die substrate vias 232 and die substrate mounting pads 235 of the die substrate 200, and, the metal lines 124 and vias 126 of the power region interconnect region 120 of the die body 105.

In some such embodiments, the first electric current pathway 420 and the second electric current pathway 430 are independent conductive pathways through the die substrate to the transistor region 130 of the die body 105. The term independent conductive pathways as used herein means that there are no common or interconnected electrical current conductive structural features (e.g., no common solder bump, vias, conductive lines, wire bonds, TSVs etc) through the die substrate 200 and the die body 105 until the currents carried along the paths 420, 430 reach the transistor region 130 of the die body 105. For instance, in some embodiment, both paths 420, 430 can contact same ones of the power rails 132 of the transistor region 130, or, two or more of the power rails 132 can be in electrical conductive contact with each other.

Embodiment of the IC package 400 can further include voltage regulator MOSFET (e.g., DrMOS) devices 450, inductors 455, capacitors 460, side edge solder pins 465 and filter capacitors 470, e.g., to help reduce the total electric current path impedance from the external power source to the die, and High Bandwidth Memory (HBM) 475.

For some embodiments of the package 400 we believe that the inclusion of the first electric current pathway 420 can reduce the total electric current path impedance from an external power source to the die by up to 50 percent, with a correspondingly similar reduction in power loss, as compared to an equivalent package without the first pathway.

Another embodiment of the disclosure is a method of manufacturing an IC package. FIG. 5 presents a flow diagram of example embodiments of a method 500 of manufacturing to provide any of the embodiments of IC package 400, the die 100 and the die substrate 200 such as disclosed in the context of FIGS. 1-4.

With continuing reference to FIGS. 1-4 throughout, the method 500 includes providing (step 505) a die body, the die body having a first body surface 110, a second body surface 112 on an opposite side of the die body as the first body surface. The die body includes an interconnect region 120 located adjacent to the first body surface, the interconnect region including interconnect dielectric layers 122 with metal lines 124 and vias 126; a transistor region 130 located above the interconnect region, wherein the metal lines and vias make electrical connections to one or more power rails 132 of the transistor region and the power rails are electrically connected to one or more transistors 134 of the transistor region; and a power region 140 located above the transistor region.

The method 500 can further include forming (step 510) one or more TSVs 144 through the power region 140 including forming (step 515) a hole 150 through the power region 140, the hole stopping on one of the power rails 132 of the transistor region 130 and then filling (step 517) the hole with a metal plug 152 such that an embedded end 148 of the TSVs contact one of the power rails of the transistor region.

In some such embodiments, forming (step 515) the hole 150 can include laser drilling or deep reaction ion etching processes where the drilling or etching stops on one of the power rails 132 and the filling (517) the hole includes electroplating or physical vapor deposition of copper, tungsten or other metals into the hole to form the metal plug. One skilled in the pertinent art would understand how, e.g., forming the hole could include depositing intermediate dielectric layers by thermal oxidation or plasma enhanced chemical vapor deposition (PECVD), and patterning such layer to form a through-hole of the desired TSV diameter 153 (e.g., from 0.001 to 1000 microns).

The method 500 can further include forming (step 520) an electro-conductive film 142 on the second surface of the die body 105 such that the electro-conductive film 142 contacts an outer end 146 of at least one of the TSVs 144.

In some such embodiments, the forming 520 of the electro-conductive film 142 can include physical or chemical vapor deposition or electroplating of copper, tungsten or other metals to form the metal plug 152. One skilled in the pertinent art would understand how physical or chemical vapor deposition or electroplating processes could be adjusted to provide the desired thickness 158 of film (e.g., from 1 to 1000 microns).

The method 500 can further include forming (step 525) a solder bump 156 on a side edge 154 of the power region 140 and in contact with the electro-conductive film 142. For example, the solder bump can be formed on the electro-conductive film 142 extending to the side edge 154 of the die, e.g., by soldering or electroplating processes familiar to those skilled in the art.

The method 500 can also include depositing (530) a sealing layer 160 on the electro-conductive film 142. In some such embodiments the depositing of the sealing layer includes chemical vapor deposition of silicon oxide (silox) on the electro-conductive film 142.

Embodiments of the method 500 can further include mounting (540) the die body 105 to a die substrate 200 including connecting solder balls 170 on the first surface of the die body to mounting pads 225 located on a first substrate surface 205 of the die substrate (e.g., by thermal reflow processes familiar to those skilled in the art).

Embodiments of the method 500 can also include forming (550) a wire bond 215 between the solder bump 156 on a side edge 154 of the power region 140 and a die substrate solder bump 220 on the first substrate surface 205, the die substrate solder bump 220 contacting an substrate conductive line 210 on the first substrate surface 205.

Another embodiment of the disclosure is computer having one or more circuits that include any embodiments of the IC package as disclosed herein.

FIG. 6 presents a block diagram of a computer 600 having one or more circuits 610 that include any embodiments of the IC package 400 using any embodiments of the die 100 and method 500 of manufacturing as disclosed herein.

Those skilled in the art to which this application relates will appreciate that other and further additions, deletions, substitutions and modifications may be made to the described embodiments.

What is claimed is:

1. A die, comprising:
    a die body, the die body having a first body surface, a second body surface on an opposite side of the die body as the first body surface, the die body including:
        an interconnect region located adjacent to the first body surface, the interconnect region including interconnect dielectric layers with metal lines and vias;
        a transistor region located above the interconnect region, wherein the metal lines and vias make electrical connections to one or more power rails of the transistor region and the power rails are electrically connected to one or more transistors of the transistor region; and
        a power region located above the transistor region, wherein the power region includes embedded TSVs and an electro-conductive film on the second body surface that traverses the second body surface to a side edge of the die body and contacts one or more solder bumps on the side edge of the die body, wherein for each one of the TSVs, an outer end of the TSV contacts the electro-conductive film and an embedded end of the TSVs contacts one of the power rails of the transistor region.

2. The die of claim 1, wherein a hole of the TSV contains a metal plug.

3. The die of claim 1, wherein a diameter of the hole is a value in a range from 0.001 to 1000 microns.

4. The die of claim 1, wherein a thickness of the electro-conductive film is a value in a range from 1 to 1000 microns.

5. The die of claim 1, further including a die substrate wherein the die body is located on a first substrate surface of the die substrate, one or more substrate conductive lines are located on the first substrate surface and a wire bond electrically connects the substrate conductive lines to the electro-conductive films.

6. The die of claim 5, wherein one end of the wire bond contacts a first solder bump located on a side edge of the die body, the first solder bump contacting the electro-conductive films and an opposite end of the wire bond contacts a die substrate solder bump on the first substrate surface, the die substrate solder bump contacting one of the substrate conductive lines.

7. The die of claim 5, wherein the die and the die substrate are part of an IC package, wherein the die substrate is mounted to a package substrate, the package substrate including package conductive lines and the package conductive lines electrically connected to form a first electric current pathway to the transistors of the die body, the first pathway including: the substrate conductive lines, the wire bond, the die substrate solder bump, the electro-conductive films and the TSVs of the power region of the die body.

8. The die of claim 7, wherein the package conductive lines are electrically connected to form a second electric current pathway to the transistors of the die body, the second pathway including: die substrate solder balls, die substrate vias and die substrate mounting pads of the die substrate, and, the metal lines and vias of the power region interconnect region of the die body.

9. The die of claim 7, wherein the first electric current pathway and the second electric current pathway are independent conductive pathways through the die substrate to the transistor region of the die body.

10. A method of manufacturing an IC package, comprising:

providing a die body, the die body having a first body surface, a second body surface on an opposite side of the die body as the first body surface and the die body including:

an interconnect region located adjacent to the first body surface, the interconnect region including interconnect dielectric layers with metal lines and vias;

a transistor region located above the interconnect region, wherein the metal lines and vias make electrical connections to one or more power rails of the transistor region and the power rails are electrically connected to one or more transistors of the transistor region; and a power region located above the transistor region; and forming one or more TSVs through the power region including forming a hole through the power region, the hole stopping on one of the power rails of the transistor region and then filling the hole with a metal plug such that an embedded end of the TSVs contact one of the power rails of the transistor region;

forming an electro-conductive film on the second surface of the die body such that the electro-conductive film contacts an outer end of at least one of the TSVs; and forming a solder bump on a side edge of the power region and in contact with the electro-conductive film.

11. The method of claim 10, wherein the forming of the one or more TSVs includes the forming the hole by laser drilling or deep reaction ion etching processes and the filling the hole to form a metal plug by electroplating or physical vapor deposition.

12. The method of claim 10, wherein a diameter of the etched hole is a value in a range from 0.001 to 1000 microns.

13. The method of claim 10, wherein the forming of the electro-conductive film includes physical or chemical vapor deposition or electroplating of copper or tungsten to form the metal plug.

14. The method of claim 10, wherein a thickness of the electro-conductive film is a value in a range from 1 to 1000 microns.

15. The method of claim 10, further including depositing a sealing layer on the electro-conductive film.

16. The method of claim 15, where the depositing of the sealing layer includes chemical vapor deposition of silicon oxide on the electro-conductive film.

17. The method of claim 10, further including mounting the die body to a die substrate including connecting solder balls on the first surface of the die body to mounting pads located on a first substrate surface of the die substrate.

18. The method of claim 17, further including forming a wire bond between the solder bump on a side edge of the power region and a die substrate solder bump on the first substrate surface, the die substrate solder bump contacting a substrate conductive line on the first substrate surface.

19. A computer having one or more circuits that include the IC package of claim 10.

20. A die, comprising:

a die body, the die body having a first body surface, a second body surface on an opposite side of the die body as the first body surface, the die body including:

an interconnect region located adjacent to the first body surface, the interconnect region including interconnect dielectric layers with metal lines and vias;

a transistor region located above the interconnect region, wherein the metal lines and vias make electrical connections to one or more power rails of the transistor region and the power rails are electrically connected to one or more transistors of the transistor region;

a power region located above the transistor region, wherein the power region includes an electro-conductive film on the second body surface, wherein for each one of the TSVs, an outer end of the TSV contacts the electro-conductive film and an embedded end of the TSVs contacts one of the power rails of the transistor region; and a die substrate wherein the die body is located on a first substrate surface of the die substrate, one or more substrate conductive lines are located on the first substrate surface and a wire bond electrically connects the substrate conductive lines to the electro-conductive film.

* * * * *